United States Patent
Chen et al.

(10) Patent No.: US 7,081,400 B2
(45) Date of Patent: Jul. 25, 2006

(54) METHOD FOR MANUFACTURING POLYSILICON LAYER AND METHOD FOR MANUFACTURING THIN FILM TRANSISTOR THEREBY

(75) Inventors: Yi-Wei Chen, Yilan (TW); Chih-Hsiung Chang, Taichung (TW); Tsung-Yi Hsu, Changhua (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 11/043,564

(22) Filed: Jan. 26, 2005

(65) Prior Publication Data
US 2006/0009013 A1    Jan. 12, 2006

(30) Foreign Application Priority Data
Jul. 8, 2004    (TW) ................. 93120500 A

(51) Int. Cl.
*H01L 21/20* (2006.01)
(52) U.S. Cl. ............... 438/482; 438/486; 257/52; 257/E33.004; 257/E23.122
(58) Field of Classification Search ........... 438/482, 438/486; 257/52
See application file for complete search history.

(56) References Cited

U.S. PATENT DOCUMENTS
2003/0061984 A1*   4/2003   Maekawa et al. ............. 117/4
2005/0019990 A1*   1/2005   Chang ...................... 438/149

FOREIGN PATENT DOCUMENTS
TW    452892    9/2001

* cited by examiner

*Primary Examiner*—Matthew Smith
*Assistant Examiner*—Nicholas J. Tobergate
(74) *Attorney, Agent, or Firm*—Thomas, Kayden, Horstemeyer & Risley

(57) ABSTRACT

A method for manufacturing polysilicon layer is provided. At first, a substrate is provided. An amorphous silicon layer having a second region and a first region is formed on the substrate. The first region is thicker than the second region. The amorphous silicon layer is completely melted to form a melted amorphous silicon layer having a first melted region and a second melted region. The temperature of the bottom center of the first melted region is lower than that of the second melted region and that of the top of the first melted region. The melted amorphous silicon layer is crystallized to form a polysilicon layer. The crystallization begins from the bottom center of the first melted region to the second melted region and the top of the first melted region.

20 Claims, 12 Drawing Sheets

METHOD FOR MANUFACTURING POLYSILICON LAYER AND METHOD FOR MANUFACTURING THIN FILM TRANSISTOR THEREBY

This application claims the benefit of Taiwan application Serial No. 93120500, filed Jul. 8, 2004, the subject matter of which is incorporated herein by reference.

BACKGROUND OF THE INVENTION

1. Field of the Invention

The invention relates in general to a method for manufacturing a polysilicon layer and a thin film transistor (TFT) using the same, and more particularly to a method of completely melting an amorphous silicon layer to laterally grow into a polysilicon layer and a thin film transistor (TFT) using the same.

2. Description of the Related Art

With advanced development of technology, flat display panels have been popularly applied to various portable electrical devices, such as notebook computers, personal digital assistants (PDAs), and cellular phones. Normally, flat display panels can be divided into amorphous silicon thin film transistor (a-Si TFT) display panels and low temperature polysilicon (LTPS) TFT display panels. The difference is that the amorphous silicon layer is transformed into a polysilicon layer in LTPS panels. Therefore, driving circuits and integrated circuits (ICs) can be integrated onto LTPS TFT panels with promoted electron mobility to provide highly freedom of nimble design in panels and circuits.

Referring to FIG. 1A to FIG. 1D, the cross-sectional views show a manufacturing flow of a conventional method for a polysilicon layer disclosed on TW Patent 452892. At first, a substrate 11 is provided and an insulating layer 40 is formed on the substrate 11, as shown in FIG. 1A. Next, an amorphous silicon layer 13 is formed on the insulating layer 40. The amorphous silicon layer 13 includes at lease one first region 13a and a second region 13b, and the thickness of the first region 13a is greater than that of the second region 13b, as shown in FIG. 1B. Then, the second region 13b of the amorphous silicon layer 13 is completely melted while the first region 13a of the amorphous silicon layer 13 is partly-melted by using an excimer laser 50 to form a melted amorphous silicon layer 60 on the residue of the first region 13a, as shown in FIG. 1C. The melted amorphous silicon layer 60 includes at least one first melted region 60a and one second melted region 60b. The melted amorphous silicon layer 60 has a temperature gradient because the temperature T4 of the center D1 of the first melted region 60a is less than the temperature T5 of the center D2 of the second melted region 60b. Further, the residue of the first region 13a is used as seed to perform re-crystallization. According to the directions of the temperature gradient in FIG. 1C, the melted amorphous silicon layer 60 is crystallized to form a polysilicon layer 14, as shown in FIG. 1D. The crystallization begins form the first melted region 60a to the second melted region 60b along the arrow in FIG. 1C.

Since the first region 13a of the amorphous silicon layer 13 is partly-melted, the melted amorphous silicon layer 60 processes lateral growth by using the residue of the first region 13a as seed so that the less grain size with respect to the first region 13a in the polysilicon layer 14 is obtained. As the result, only the region with respect to the second region 13b in the polysilicon layer 14 can be used to be channel regions of electrical devices, such as the polysilicon channel regions of a LTPS TFT, source and drain of which is with respect to the first region 13a of the amorphous silicon layer 13. However, because a grain boundary and the residue of the first region 13a are on the channel regions of the polysilicon layer 14 with respect to the second region 13b, the electron mobility of electrical devices is diminished and the electrical property of LTPS TFT is greatly influenced.

SUMMARY OF THE INVENTION

It is therefore an object of the invention to provide a method for manufacturing a polysilicon layer and a thin film transistor (TFT) using the same by completely melting the amorphous silicon layer having a first region with a thicker thickness and a second region with a thinner thickness so that the less grain size formed on a region in the polysilicon layer with respect to the first region is prevented. Therefore, the region in the polysilicon layer with respect to the first region can be used to be channel regions of a LTPS TFT, so that the electron mobility of LTPS TFT is increased and the electrical quality of LTPS TFT is improved.

The invention achieves the above-identified object by providing a method for manufacturing a polysilicon layer. At first, a substrate is provided. Next, an amorphous silicon layer having a first region and a second region is formed on the substrate. The second region and the first region respectively have a first thickness and a second thickness. The first thickness is greater than the second thickness. Then, the amorphous silicon layer is completely melted to form a melted amorphous silicon layer having a first melted region and a second melted region. A first temperature of the bottom center of the first melted region is lower than a second temperature of a top of the first melted region and a third temperature of the second melted region. The melted amorphous silicon layer is crystallized to form a polysilicon layer. The crystallization begins from the bottom center of the first melted region to the second melted region and to the top of the first melted region.

The invention achieves the above-identified object by providing a method for manufacturing a thin film transistor (TFT) layer. At first, a substrate is provided. At first, a substrate is provided. Next, an amorphous silicon layer having a first region and a second region is formed on the substrate. The second region and the first region respectively have a first thickness and a second thickness. The first thickness is greater than the second thickness. Then, the amorphous silicon layer is completely melted to form a melted amorphous silicon layer having a first melted region and a second melted region. So that, a first temperature of the bottom center of the first melted region is lower than a second temperature of a top of the first melted region and a third temperature of the second melted region. The melted amorphous silicon layer is crystallized to form a polysilicon layer. So that, the crystallization begins from the bottom center of the first melted region to the second melted region and to the top of the first melted region. Part of the polysilicon layer is removed to form a polysilicon island. Both ends of the polysilicon island are doped to form two heavily-doped type (N+) ohmic contact regions. A gate insulating layer is formed on the two N+ ohmic contact regions and the residue of the polysilicon island. Both ends of the residue of the polysilicon island are doped to form two lightly-doped type (N−) ohmic contact regions between the N+ ohmic contact regions and a polysilicon channel region. The polysilicon channel region corresponds to the first region of the amorphous silicon layer. A gate on the gate insulating layer is formed. A dielectric layer is formed to cover the gate and the gate insulating layer. The dielectric layer and the gate insulating layer respectively have a first contact hole and a second contact hole to expose the two N+ ohmic contact regions. A source and a drain are formed on the dielectric layer corresponding to the second regions adjacent to the first region of the amorphous silicon layer. The source and the drain are electrically connected to the two N+ ohmic contact regions via the first contact hole and the second contact hole, respectively. A passivation layer having a third contact hole is formed on the dielectric layer to cover the source and the drain. The third contact hole is for exposing part of the source or the drain. An electrode is formed on the passivation layer. The electrode is electrically connected to the source or the drain via the third contact hole.

It is another object of the invention to provide a method for crystallizing an amorphous silicon layer having a first region and a second region. A first thickness of the first region is greater than a second thickness of the second region. At first, the amorphous silicon layer is completely melted to form a melted amorphous silicon layer having a first melted region and a second melted region by an excimer laser. A first temperature of the bottom center of the first melted region is lower than a second temperature of a top of the first melted region and a third temperature of the second melted region. Then, the melted amorphous silicon layer is crystallized to form a polysilicon layer. The crystallization begins from the bottom center of the first melted region to the second melted region and to the top of the first melted region.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1A:
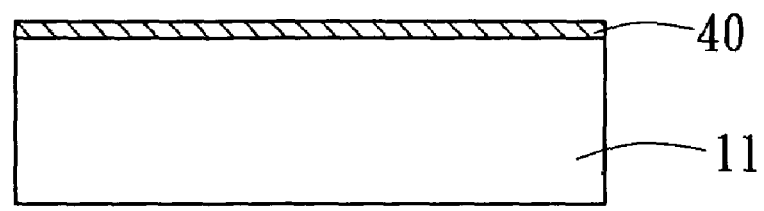
FIGS. 1A to 1D (Prior Art) are cross-sectional views showing a flow chart of a conventional method for manufacturing a polysilicon layer disclosed on TW Patent 452892.
Figure 1B:
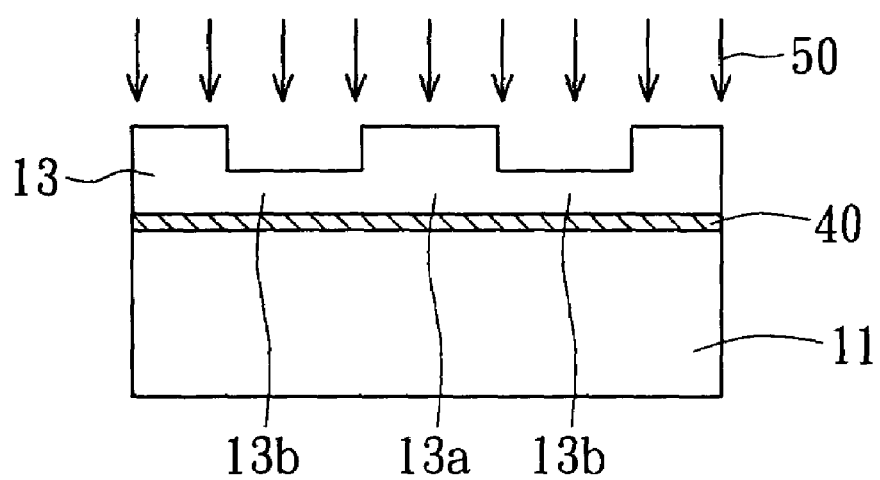
Figure 1C:
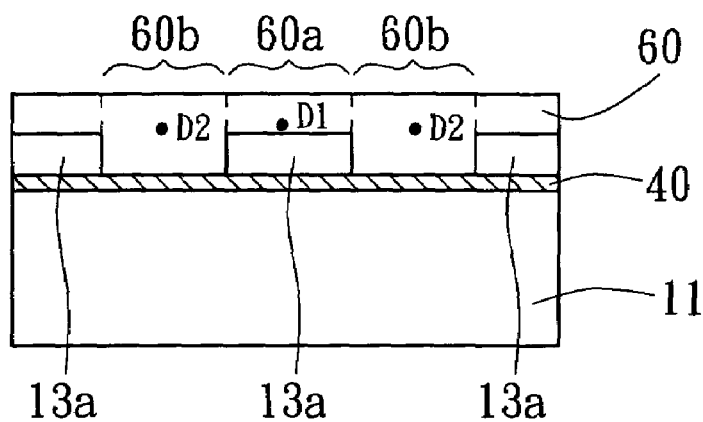
Figure 1D:
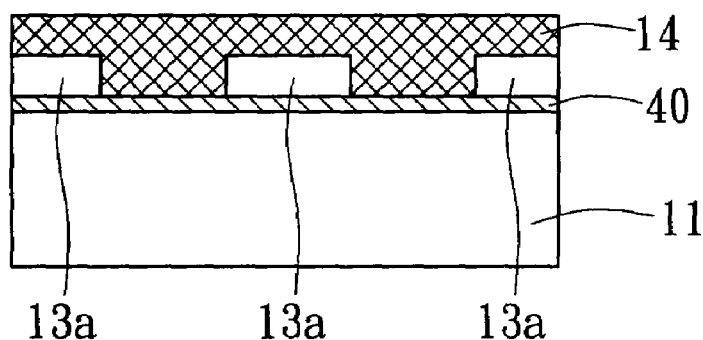
Figure 2A:
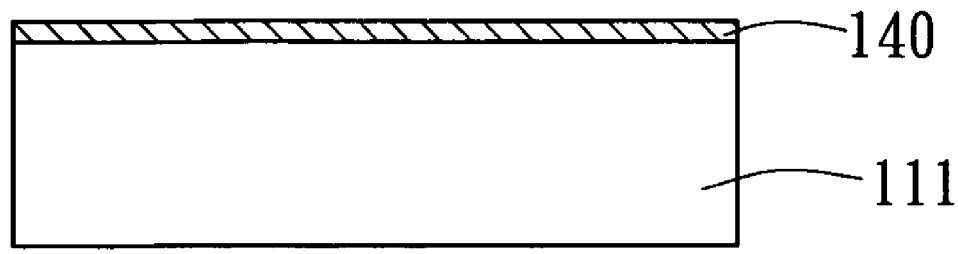
FIGS. 2A to 2D are cross-sectional views showing a flow chart of a method for manufacturing a polysilicon layer according to the preferred embodiment of the invention.
Figure 2B:
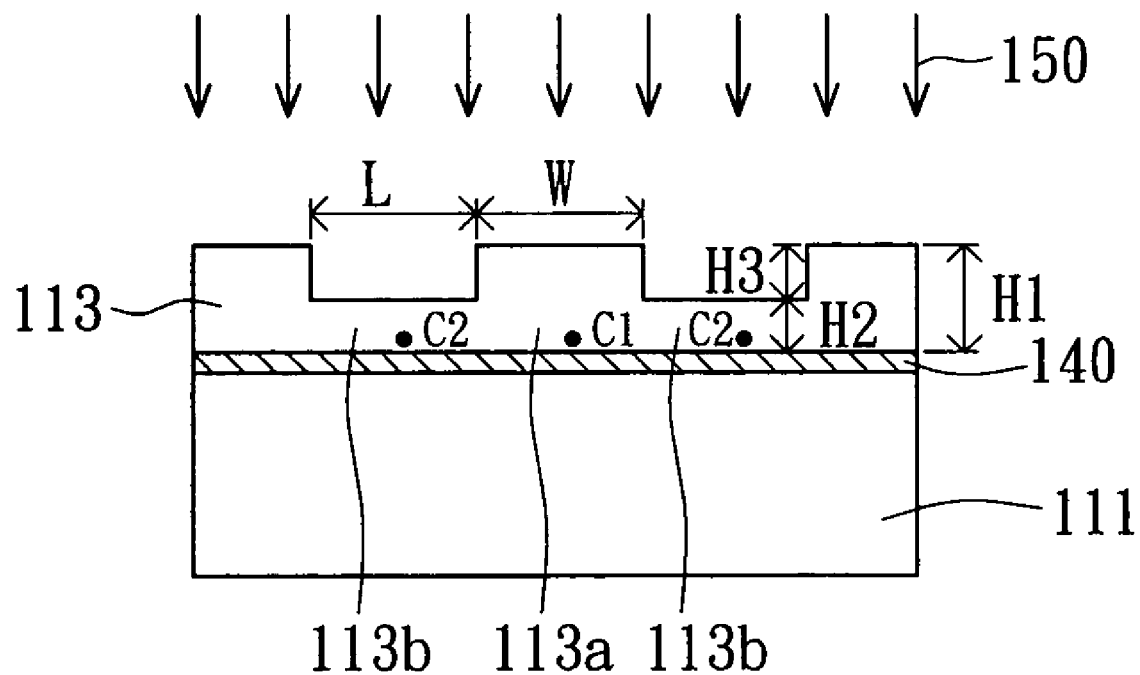

Referring to FIGS. 2A to 2D, they are cross-sectional views showing a flow chart of a method for manufacturing a polysilicon layer according to the preferred embodiment of the invention. At first, a substrate 111 is provided and an insulating layer 140 is formed on the substrate 111, as shown in FIG. 2A. The substrate 111 is a preferred glass substrate, or a plastic substrate, and the material of the insulating layer 140 is a preferred silicon dioxide ($SiO_2$), silicon nitride, or nitride. Next, an amorphous silicon layer 113 is formed on the insulating layer 140, as shown in FIG. 2B. The amorphous silicon layer 113 includes at lease one first region 113a and a second region 113b, and the first region 113a and the second region 113b respectively have a first thickness H1 and a second thickness H2. The first thickness H1 is greater than the second thickness H2 and has a difference of a third thickness H3.

In the preferred embodiment, the first region 113a and the second region 113b are long strip-shaped structures, the width of the first region 113a is W, and the width of the second region 113b is L. W is about 1 to 5 μm and L is about 1 to 5 μm. Also, the first thickness H1 is about 500–1000 Å, and the second thickness H2 is about 150 to 500 Å, preferably, the first thickness H1 is 650 Å, and the second thickness H2 is 250 Å.

Referring to FIG. 2B, the amorphous silicon layer 113 is completely melted into a melted amorphous silicon layer 160 by using an excimer laser 150. Next, in FIG. 2C, the melted amorphous silicon layer 160 includes at least one first melted region 160a and a second melted region 160b, the bottom center B1 of the first melted region 160a corresponds to the bottom center C1 of the first region 113a of FIG. 2B, and the bottom center B2 of the second melted region 160b corresponds to the bottom center C2 of the second region 113b of FIG. 2B. The temperature of the first melted region 160a is lower than that of the second melted region 160b.

The temperature T1 of the bottom center B1 of the first melted region 160a is lower than the temperature T2 of the bottom center B2 of the second melted region 160b, so that a temperate gradient exists in the melted amorphous silicon layer 160. Besides, the temperature of the second melted region 160b is higher than the temperature T1 of the bottom center B1 of the first melted region 160a, and the temperature T1 of the bottom center B1 of the first melted region 160a is lower than the temperature T3 of the top B3 of the first melted region 160a. The melted amorphous silicon layer 160 has a fourth thickness H4, and H4 is about 200 to 900 Å.

In the beginning of the melting process of the amorphous silicon layer 113, the temperature of the bottom center C1 of the first region 113a is lower than the surface temperature of the first region 113a and the bottom center C2 of the second region 113b. Consequently, a temperature gradient is formed there between. Next, when the energy of the excimer laser 150 reaches the energy level for completely melting the second region 113b, the second region 113b and part of the first region 113a is melted, remaining part of the first region 113a close to the surface of the insulating layer 140. As the melting process continues, the remaining part of the first region 113a will be melted and the whole amorphous silicon layer 113 will be completely melted into the melted amorphous silicon layer 160. The melted second region 113b will absorb higher energy. The first region 113a covers the completely melted second region 113b after being completely melted to form the first melted region 160a and the second melted region 160b, both of which have same thickness. The bottom center B2 of the second melted region 160b absorbs higher energy than the bottom center B1 of the first melted region 160a does, so that the temperature T2 of the bottom center B2 of the second melted region 160b is higher than the temperature T1 of the bottom center B1 of the first melted region 160a.

Figure 2C:
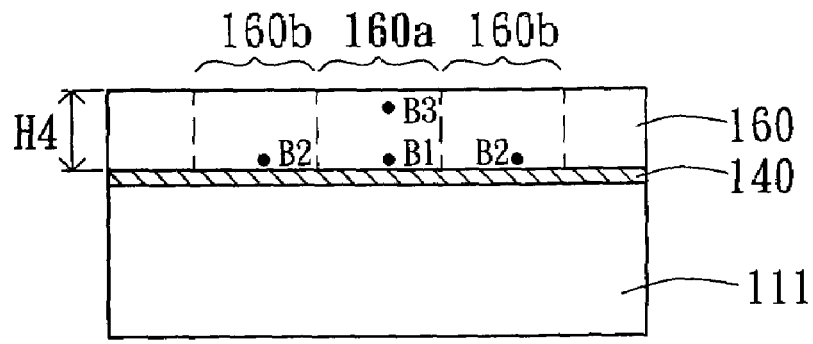
Figure 2C:
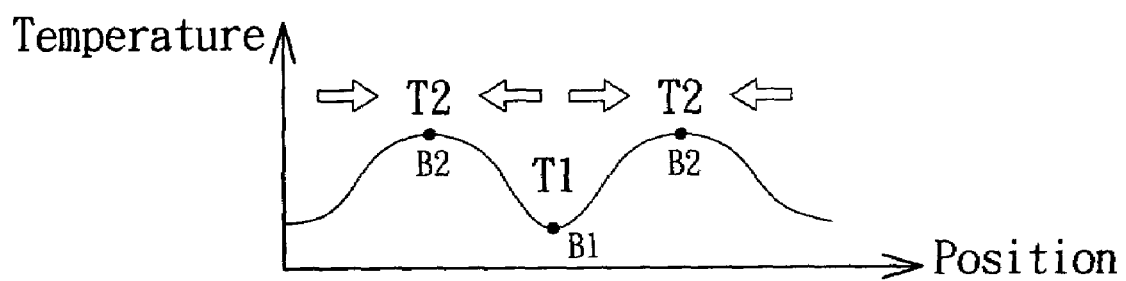
Figure 2D:
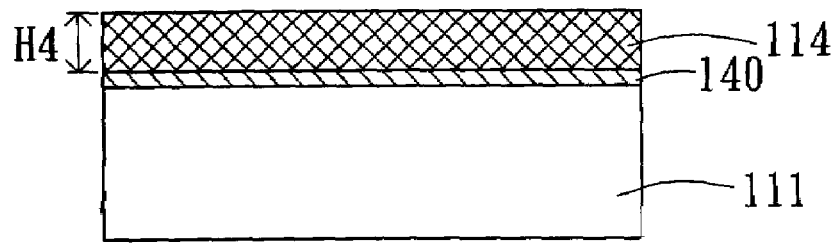

After the amorphous silicon layer 113 is completely melted into the melted amorphous silicon layer 160, the melted amorphous silicon layer 160 is crystallized to form a polysilicon layer 114 on the insulating layer 140. The crystallization begins from the bottom center B1 of the first melted region 160a to the second melted region 160b and the top B3 of the first melted region 160a along the arrow in FIG. 2C to form a polysilicon layer 114, as shown in FIG. 2D. Also, the polysilicon layer 114 has the fourth thickness H4 that is same as the melted amorphous silicon layer 160, and H4 is about 200 to 900 Å.

A grain boundary is formed on the center of the polysilicon layer 114 with respect to the second melted region 160b, the center of the second region 113b. As a result, a region of the polysilicon layer 114 first region 13a with respect to the first melted region 160a, the first region 113a, can be used as a channel region of electrical devices, such as a polysilicon channel region of a LTPS TFT.

Figure 3A:
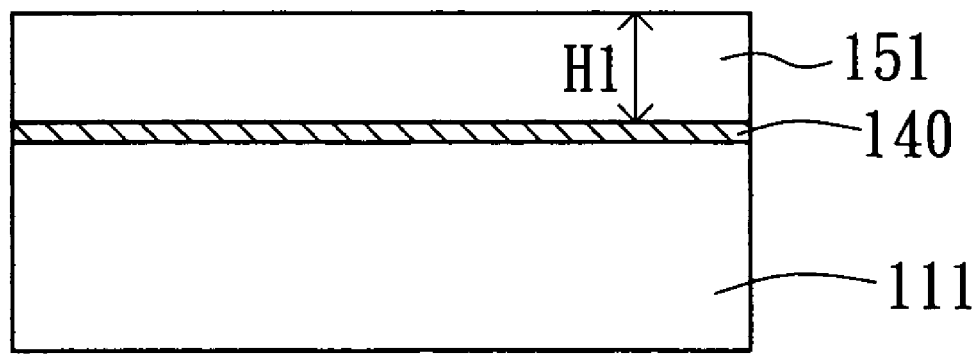
FIGS. 3A and 3B are cross-sectional views showing a flow chart of a method for forming an amorphous silicon layer.
Figure 3B:
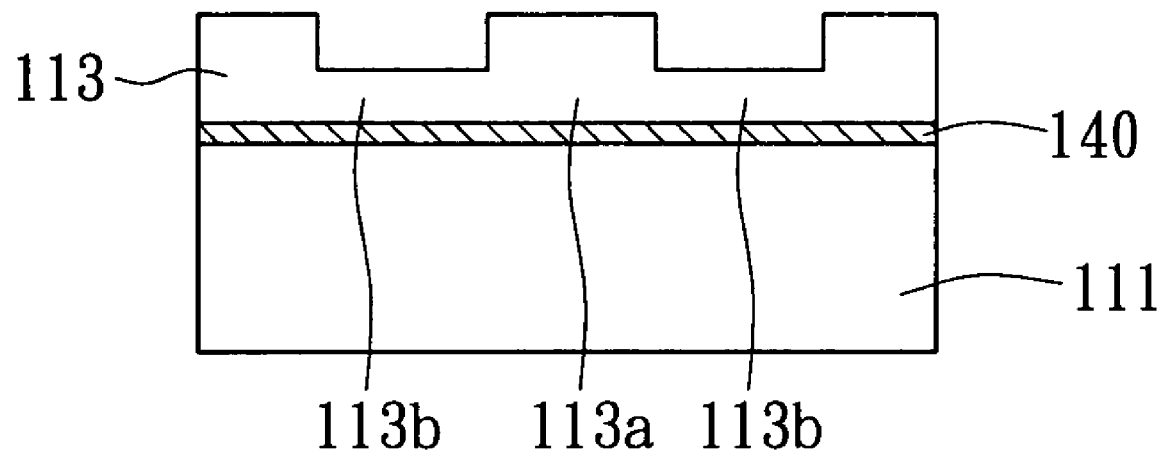

However, the present invention is not limited thereto. For example, there are various ways of forming the amorphous silicon layer 113, and two ways are present as below. In the first way of forming the amorphous silicon layer 113, a first amorphous silicon layer 151 with the first thickness H1 is firstly formed on the insulating layer 140 by plasma enhanced chemical vapor deposition (PECVD), and hydrogen is removed from the first amorphous silicon layer 151 in a furnace of 400 degree, as shown in FIG. 3A. Next, the first amorphous silicon layer 151 is defined to have a pattern of the first region and the second region by photolithography, and the first amorphous silicon layer 151 is etched to formed the first region 113a and the second region 113b of the amorphous silicon layer 113, as shown in FIG. 3B.

Figure 4A:
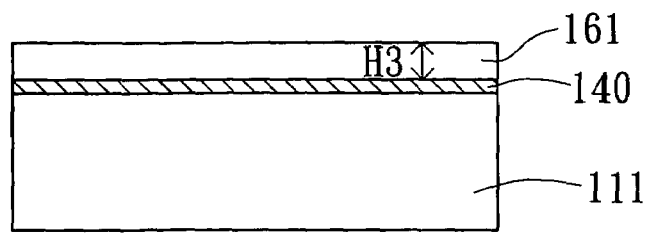
FIGS. 4A to 4C are cross-sectional views showing a flow chart of another method for forming an amorphous silicon layer.
Figure 4B:
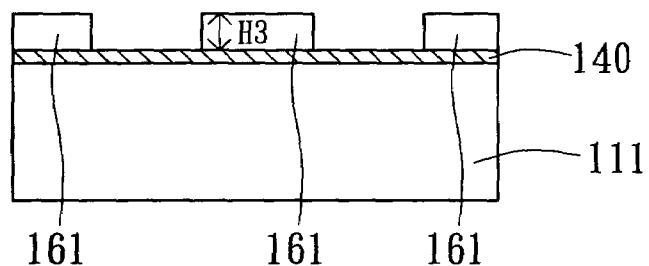
Figure 4C:
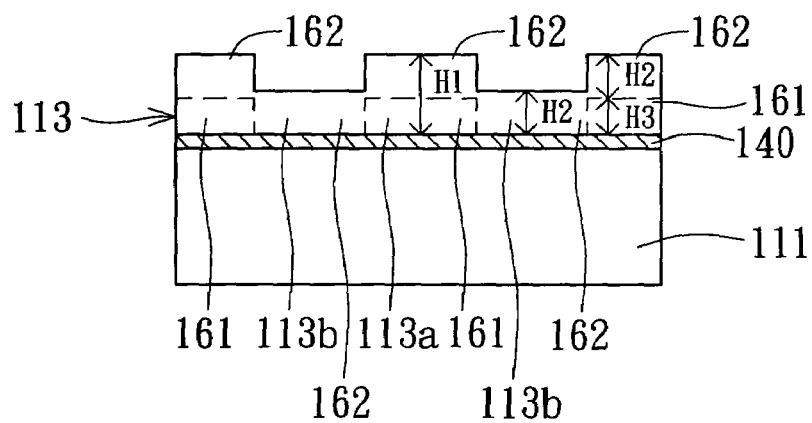

On the other hand, in the second way of forming the amorphous silicon layer 113, firstly, a first amorphous silicon layer 161 with the third thickness H3 is formed on the insulating layer 140 by PECVD, and hydrogen is removed from the first amorphous silicon layer 161 in furnace of 400 degree, as shown in FIG. 4A. Next, the first amorphous silicon layer 161 is defined to have a pattern of the first region and the second region by photolithography, and the first amorphous silicon layer 161 is etched so that part of the insulating layer 140 is exposed, as shown in FIG. 4B. And then, a second amorphous silicon layer 162 with the second thickness H2 is formed on part of the first amorphous silicon layer 161 by PECVD and hydrogen is removed from the second amorphous silicon layer 162 in furnace of 400 degree, as shown in FIG. 4C. Therefore, the second amorphous silicon layer 162 and part of the first amorphous silicon layer 161 together form the amorphous silicon layer 113 with the first region 113a and the second region 113b. The sum of the second thickness H2 and the third thickness H3 is the first thickness H1.

Figure 5:
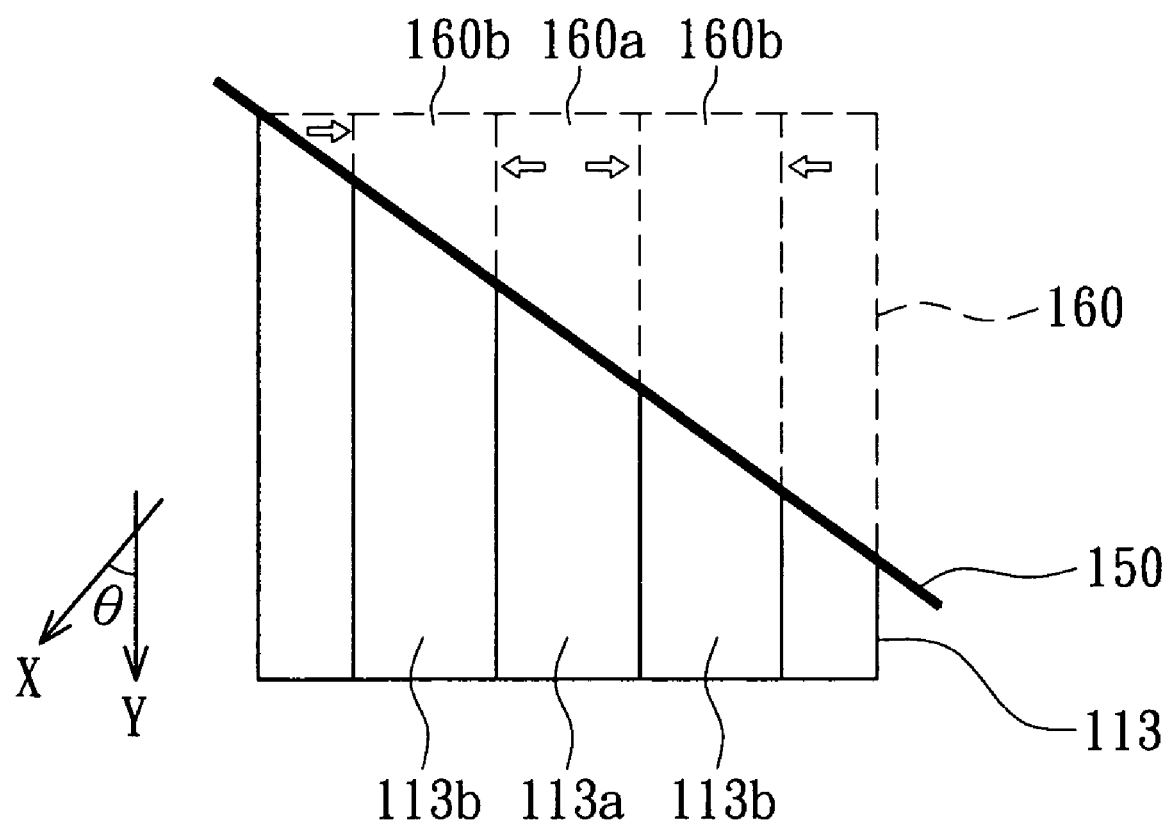
FIG. 5 is a top view showing that using an excimer laser completely melts the amorphous silicon layer.

Referring both to FIG. 2B and FIG. 5, FIG. 5 is a top view showing that the energy of the excimer laser melts the amorphous silicon layer of FIG. 2B. In FIG. 5, the first region 113a and the second region 113b are long-bar shaped structures, the extended direction of the first region 113a and the second region 113b is Y, the scanning direction of the excimer laser 150 is X. At first, the amorphous silicon layer 113 is scanned by the excimer laser 150. The scanning direction X has an included angle θ with respect to the extended direction Y of the first region 113a and the second region 113b. In one embodiment of the invention, the included angle θ is 45 degrees. Next, the amorphous silicon layer 113 is completely melted into the melted amorphous silicon layer 160, as shown in FIG. 2C. Because the melted amorphous silicon layer 160 has a temperature gradient, the melted amorphous silicon layer 160 is crystallized to form the polysilicon layer 114. The crystallization begins from the bottom center of the first melted region 160a to the second melted region 160b and the top of the first melted region 160a along the direction of the arrow, as shown in FIG. 2D. The design of forming an included angle θ between the scanning direction X of the excimer laser 150 and the extended direction Y of the first region 113a and the second region 113b allows the melted amorphous silicon layer 160 to lateral grow into the polysilicon layer 114 with greater grain size.

Figure 6:
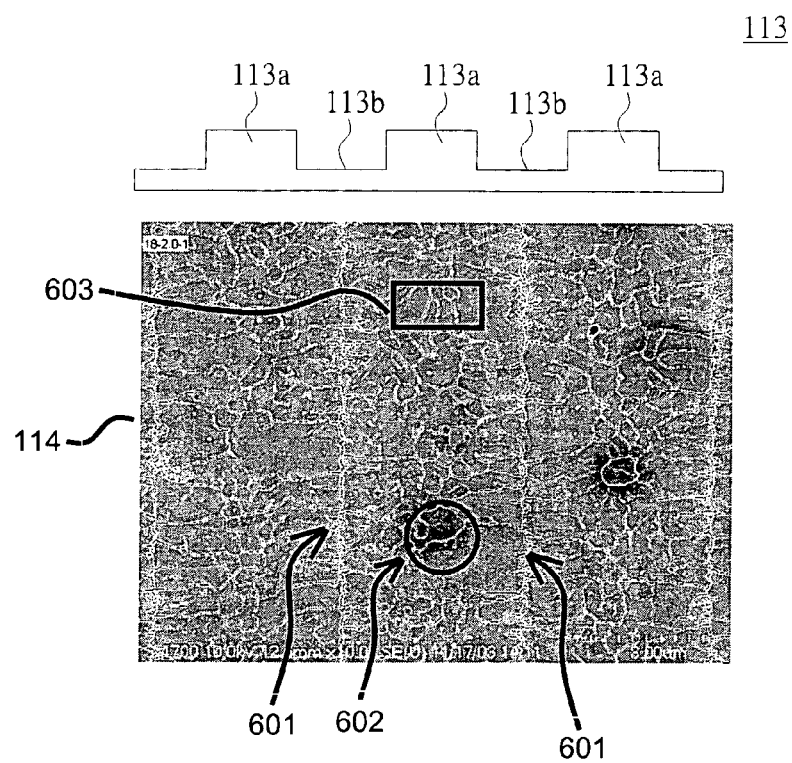
FIG. 6 is a comparison between a SEM picture of the polysilicon layer crystallized from the melted amorphous silicon layer and a cross-sectional view of the amorphous silicon layer
Figure 7:
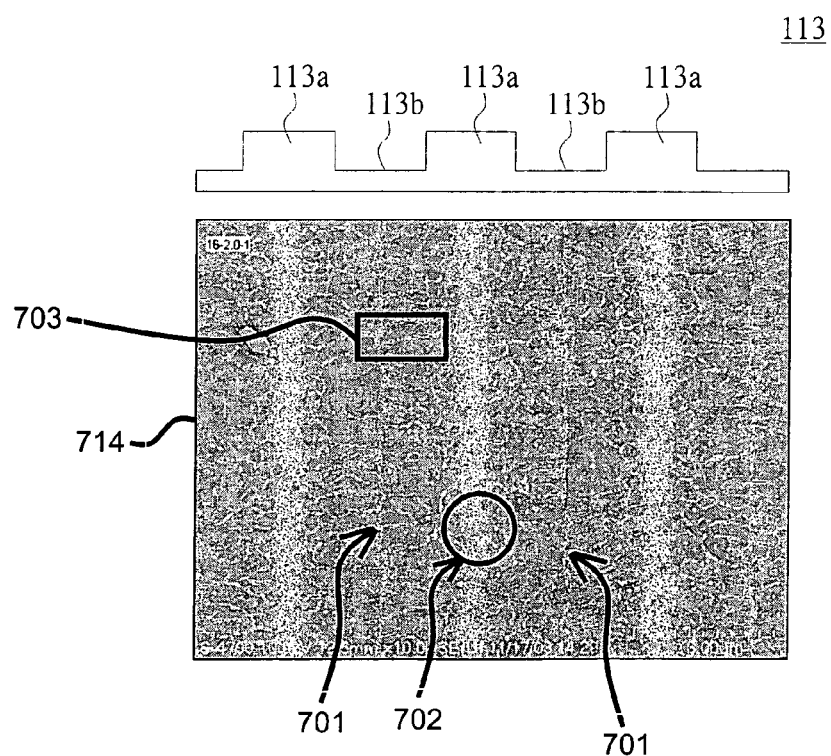
FIG. 7 is a comparison between a SEM picture of the polysilicon layer crystallized from the melted second region and the partly melted first region of the amorphous silicon layer and a cross-sectional view of the amorphous silicon layer.

Referring both to FIG. 6 and FIG. 7, FIG. 6 is a comparison between a SEM picture of the surface of the polysilicon layer crystallized from the melted amorphous silicon layer and a cross-sectional view of the amorphous silicon layer, and FIG. 7 is a comparison between a SEM picture of the surface of the polysilicon layer crystallized from the melted second region and the partly-melted first region of the amorphous silicon layer and a cross-sectional view of the amorphous silicon layer. In FIG. 6 and FIG. 7, a grain boundary 601 is formed on the polysilicon layer 114 with respect to the center of the second region 113b, and a grain boundary 701 is formed on the polysilicon layer 714 with respect to the center of the second region 113b. Because the amorphous silicon layer 113 in FIG. 6 is completely melted and, the first region 113a of the amorphous silicon layer 113 is partly-melted in FIG. 7, conventionally, the structure of the polysilicon layer 714 and the conventional structure of the polysilicon 14 is the same. Also, the grain size of the polysilicon grain 602 on the polysilicon layer 114 with respect to the first region 113a is greater than that of the polysilicon grain 702 on the polysilicon layer 714 with respect to the first region 113a.

Conventionally, the first region 113a in FIG. 7 is half melted so that the widths of the first region 113a and the second region 113b limit to a less scope, and the less grain size of the polysilicon layer 714 is formed. As the result, the polysilicon grains 702 with less grain size are formed in the place in the polysilicon layer 714 with respect to the first region 113a, and only the place in the polysilicon layer 714 with respect to the second region 113b can be used to be channel region of electrical devices, such as the polysilicon channel region of a LTPS TFT. Also, a grain boundary 701 and the residue of the first region 113a are on the center of the channel region 703 of the electrical devices, so that the electron mobility in the channel region 703 of the electrical devices is decreased to have great bad influence on the electrical quality of the LTPS TFT, which is the disadvantage of the conventional method to form a polysilicon layer.

In the present invention, polysilicon grains 602 with greater grain size are formed in the place in the polysilicon layer 114 with respect to the first region 113a in FIG. 6, and the place in the polysilicon layer 114 with respect to the first region 113a is used to be channel region 603 of electrical devices. Also, there is no any grain boundary in the channel region 603 of the electrical devices, and the position of the source/drain of the LTPS TFT is corresponding to the second region 113b of the amorphous silicon layer 113, so that the electron mobility in the channel region 603 of the electrical devices is highly promoted and the electrical property of LTPS TFT is improved.

Figure 8A:
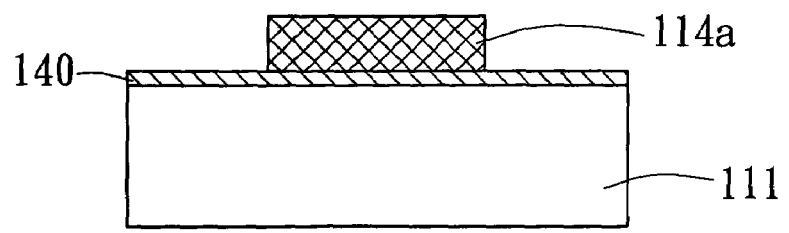
FIGS. 8A to 8G are cross-sectional views showing a flow chart of a method for manufacturing a LTPS TFT according to the preferred embodiment of the invention.
Figure 8B:
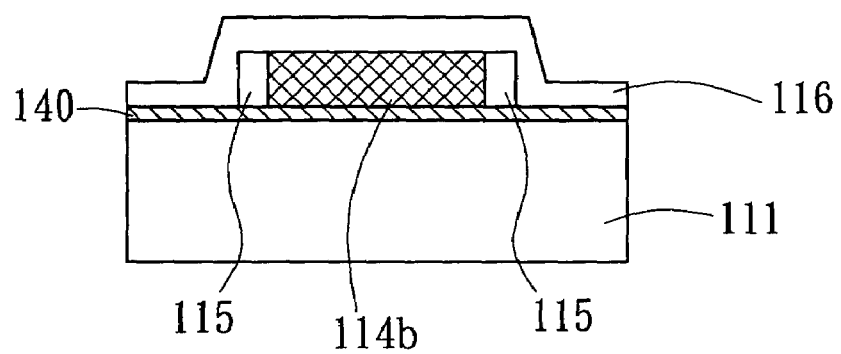
Figure 8C:
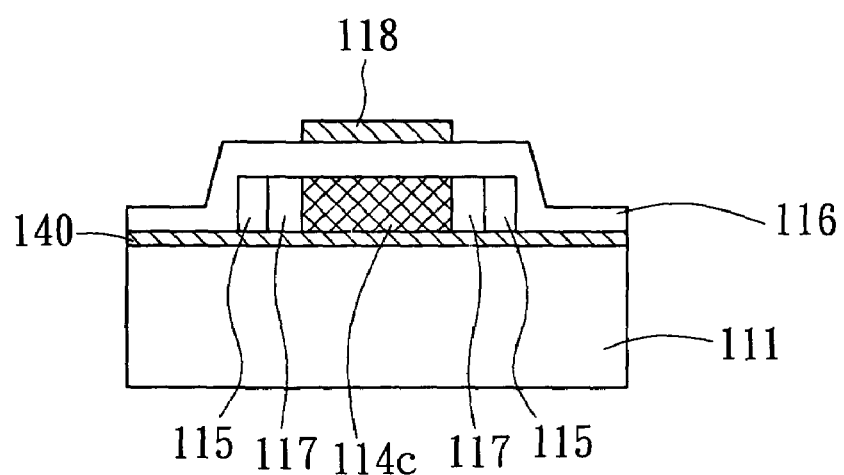

Moreover, after the step of crystallizing to form the polysilicon layer 114, the method further includes several steps as below. As first, part of the polysilicon layer 114 is removed to form at least one polysilicon island 114a on the insulating layer 140, as shown in FIG. 8A. Next, both ends of the polysilicon island 114a are doped to form two heavily-doped type (N+) ohmic contact region 115 on residue of both ends of the polysilicon island 114b. A gate insulating layer 116 is formed on the insulating layer 140 for covering the two N+ ohmic contact region 115 and the residue of the polysilicon island 114b, as shown in FIG. 8B. And then, both ends of the residue of the polysilicon island 114b are doped to form two lightly-doped type (N−) ohmic contact region 117 between the two N+ ohmic contact region 115 and a polysilicon channel region 114c, as shown in FIG. 8C. The two N− ohmic contact region 117 is the light doping drain (LDD). The polysilicon channel region 114c is respect to the first region 113a of the amorphous silicon layer 113. Also, a gate 118 is formed on the gate insulating layer 116 with respect to the polysilicon channel region 114c.

Figure 8D:
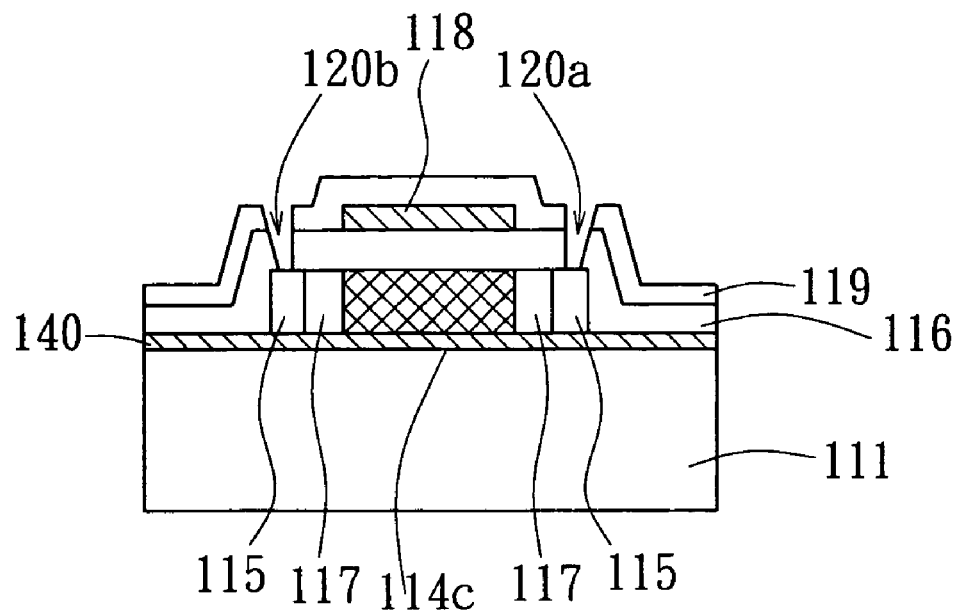
Figure 8E:
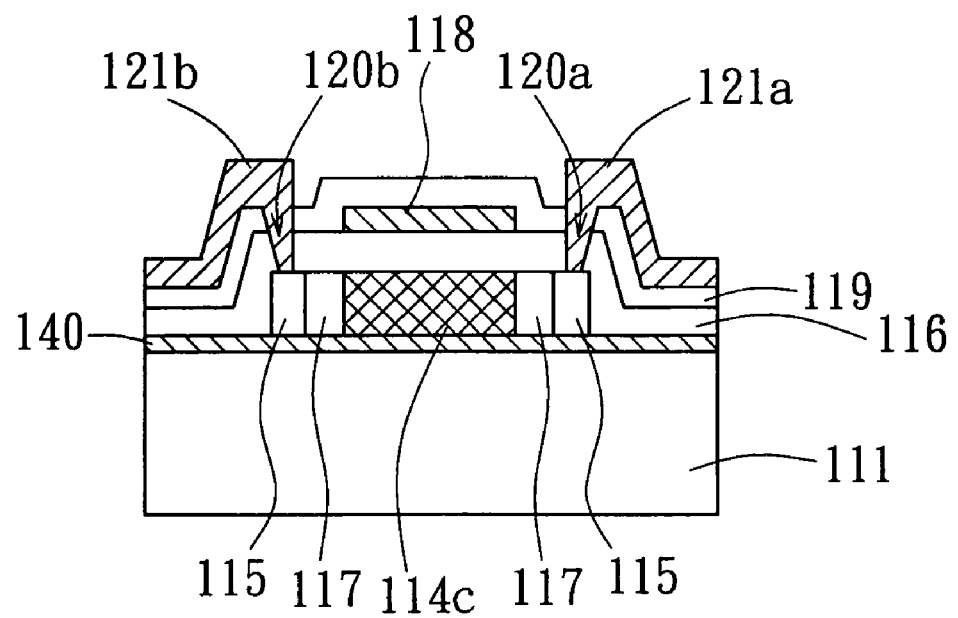

In FIG. 8D, a dielectric layer 119 is formed on the gate insulating layer 116 to cover the gate 118 and the gate insulating layer 116. The dielectric layer 119 and the gate insulating layer 116 respectively have a first contact hole 120a and a second contact hole 120b, both of which are on two sides of the gate 118 for exposing part of the two N+ ohmic contact region 115. In FIG. 8E, a source 121a and a drain 121b are on part of the dielectric layer 119 and are on two sides of the gate 118. The source 121a and the drain 121b are electrically connected to the N+ ohmic contact region 115 via the first contact hole 120a and the second contact hole 120b respectively. The source 121a and the drain 121b are positioned with respect to two second regions 113b near the first region 113a of the amorphous silicon layer 113.

Figure 8F:
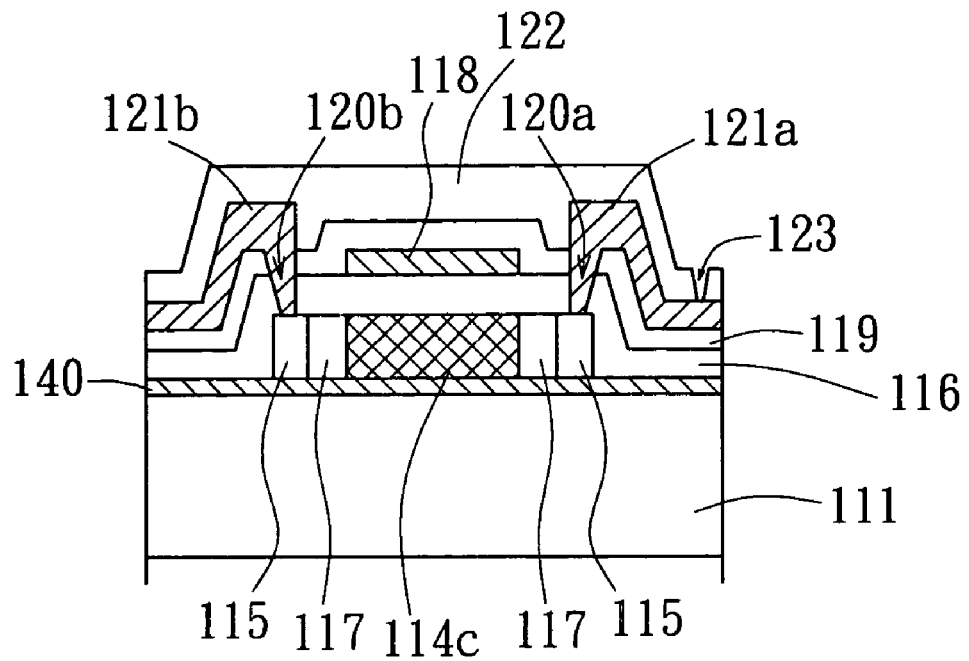
Figure 8G:
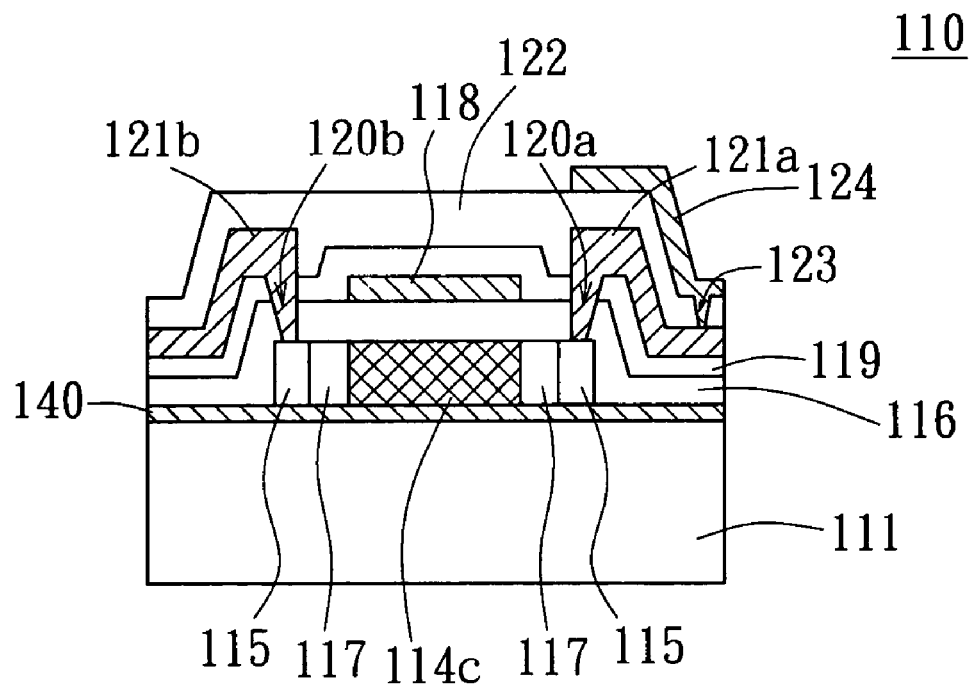

In FIG. 8F, a passivation layer 122, having a third contact hole 123 for exposing part of the source 121a or the drain 121b, on the dielectric layer 119 to cover the source 121a and the drain 121b. In FIG. 8G, an electrode 124 is formed on the passivation layer 122 and the electrode 124 is electrically connected to the source 121a or the drain 121b via the third contact hole 123, preferably the electrode 124 is electrically connected to the source 121a, and the LTPS TFT 110 is obtained. The electrode 124 is an indium tin oxide (ITO) or a reflective electrode. FIGS. 2A to 2D are cross-sectional views showing a flow chart of a method for manufacturing a polysilicon layer according to the preferred embodiment of the invention, and FIGS. 8A to 8G are cross-sectional views showing a flow chart of a method for manufacturing a LTPS TFT according to the preferred embodiment of the invention.

Figure 9:
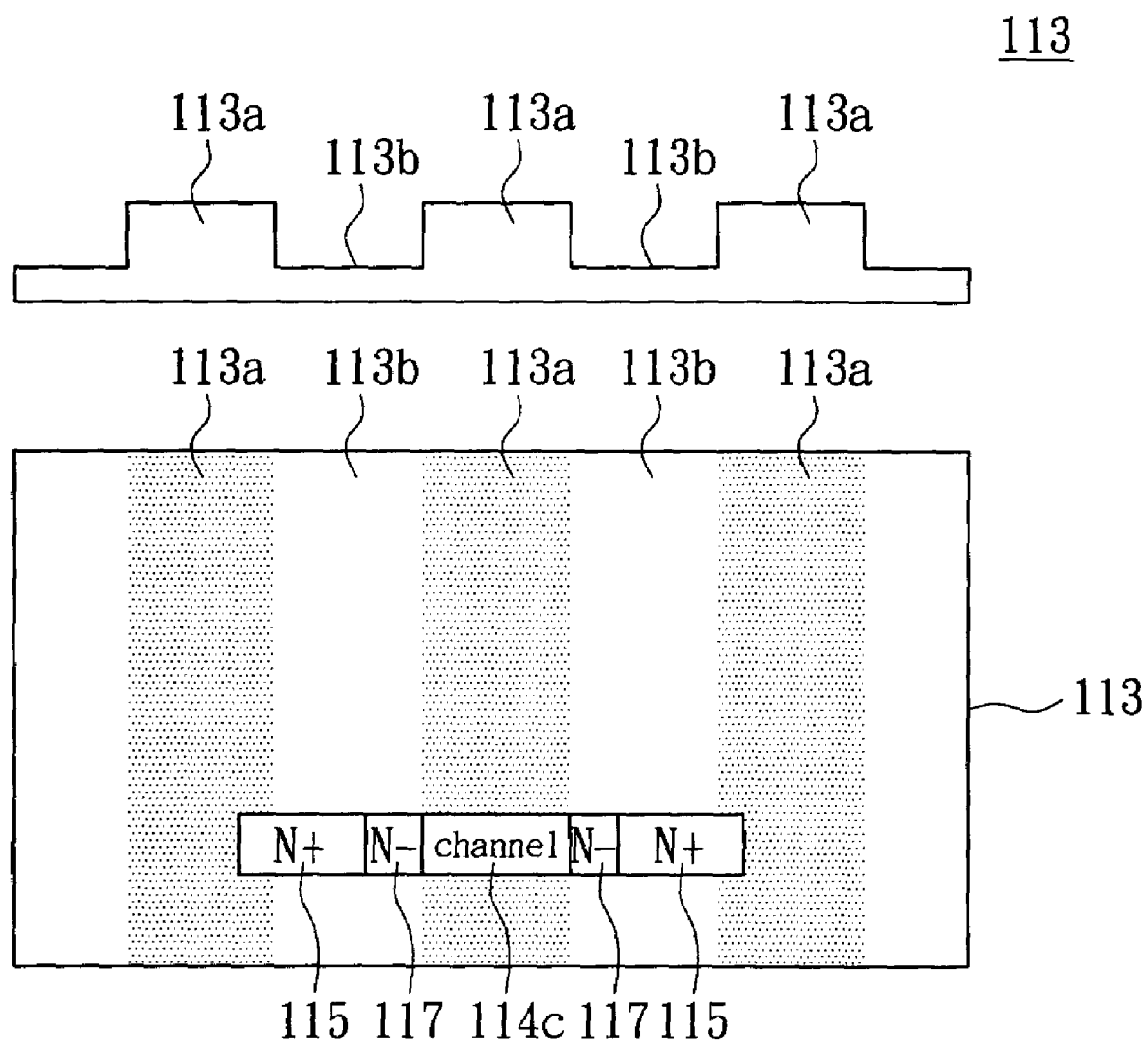
FIG. 9 is a vertical view showing a comparison between the polysilicon channel region, N+ ohmic contact region, N− region and amorphous silicon layer.

Referring to FIG. 9, it is a vertical view showing comparison between the polysilicon channel region, N+ ohmic contact region, N− ohmic contact region and amorphous silicon layer. The polysilicon channel region 114c is positioned with respect to the first region 113a of the amorphous silicon layer 113, and the two N+ ohmic contact region 115 and the two N− ohmic contact region 117 are respectively positioned with respect to the two second regions 113b near the first region 113a of the amorphous silicon layer 113. Also, the source 121a and the drain 121b are positioned with respect to the two second regions 113b of the amorphous silicon layer 113.

Because the greater grain size and more uniform distribution in the polysilicon layer 114 than the conventional one, the electron mobility of the LTPS TFT 110 of the present invention is higher than that of the previous LTPS TFT having a polysilicon layer 14 as the channel region way. Therefore, the electron mobility of LTPS TFT is increased and the electrical property of LTPS TFT is improved.

The preferred embodiment discloses the method for manufacturing a polysilicon layer and a thin film transistor (TFT) using the same completely melting first region with thicker thickness and second region with thinner thickness of the polysilicon layer to prevent the less grain size formed on a region in the polysilicon layer with respect to the first region. Therefore, the region in the polysilicon layer with respect to the first region can be used to be channel region of a LTPS TFT, so that the electron mobility of LTPS TFT is increased and the electrical property of LTPS TFT is improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a polysilicon layer, comprising:
   providing a substrate;
   forming an amorphous silicon layer having a first region and a second region on the substrate, wherein the first region and the second region respectively have a first thickness and a second thickness, and the first thickness is greater than the second thickness;
   completely melting the amorphous silicon layer to form a melted amorphous silicon layer having a first melted region and a second melted region, so that a first temperature of a bottom center of the first melted region is lower than a second temperature of a top of the first melted region and a third temperature of the second melted region; and
   crystallizing the melted amorphous layer to form a polysilicon layer, so that the crystallization begins from the bottom center of the first melted region to the second melted region and to the top of the first melted region.

2. The method according to claim 1, wherein the step of forming an amorphous silicon layer comprises:
   forming a first amorphous silicon layer with the first thickness; and
   removing part of the first amorphous silicon layer to form the amorphous silicon layer having the first region and the second region.

3. The method according to claim 1, wherein the step of forming an amorphous silicon layer comprises:
   forming a first amorphous silicon layer with a third thickness;
   removing part of the first amorphous silicon layer; and
   forming a second amorphous silicon layer with the second thickness on the substrate, so that the sum of the second thickness and the third thickness substantially equals to the first thickness.

4. The method according to claim 1, wherein the step of completely melting the amorphous silicon layer comprises:
   scanning the amorphous silicon layer with an excimer laser, wherein the scanning direction has an included angle with respect to the extended direction of the first region and the second region.

5. The method according to claim 4, wherein the included angle is about 45 degrees.

6. The method according to claim 1, further comprising forming an insulating layer on the substrate before the step of forming an amorphous silicon layer.

7. The method according to claim 1, wherein the substrate comprises a glass substrate.

8. A method for manufacturing a thin film transistor (TFT) comprising:
   providing a substrate;
   forming an amorphous silicon layer having a first region and a second region on the substrate, wherein the first region and the second region respectively have a first thickness and a second thickness, and the first thickness is greater than the second thickness;
   completely melting the amorphous silicon layer to form a melted amorphous silicon layer having a first melted region and a second melted region, so that a first temperature of a bottom center of the first melted region is lower than a second temperature of a top of the first melted region and a third temperature of the second melted region;
   crystallizing the melted amorphous layer to form a polysilicon layer, so that the crystallization begins from the bottom center of the first melted region to the second melted region and to the top of the first melted region;
   removing part of the polysilicon layer to form a polysilicon island;
   doping both ends of the polysilicon island to form two heavily-doped type (N+) ohmic contact regions;
   forming a gate insulating layer on the two N+ ohmic contact regions and the residue of the polysilicon island;
   doping both ends of the residue of the polysilicon island to form two lightly-doped type (N−) ohmic contact regions between the N+ ohmic contact regions and a polysilicon channel region, wherein the polysilicon channel region corresponds to the first region of the amorphous silicon layer;
   forming a gate on the gate insulating layer;
   forming a dielectric layer to cover the gate and the gate insulating layer, wherein the dielectric layer and the gate insulating layer respectively have a first contact hole and a second contact hole to expose the two N+ ohmic contact regions;
   forming a source and a drain on the dielectric layer corresponding to the second regions adjacent to the first region of the amorphous silicon layer, wherein the source and the drain are electrically connected to the two N+ ohmic contact regions via the first contact hole and the second contact hole, respectively;
   forming a passivation layer on the dielectric layer to cover the source and the drain, with a third contact hole formed therein to expose part of the source or the drain; and
   forming an electrode on the passivation layer, wherein the electrode is electrically connected to the source or the drain via the third contact hole.

9. The method according to claim 8, wherein the electrode is a transparent electrode or a reflective electrode.

10. The method according to claim 8, wherein the electrode comprises indium tin oxide (ITO).

11. The method according to claim 8, wherein the step of forming an amorphous silicon layer comprises:
   forming a first amorphous silicon layer with the first thickness; and
   removing part of the first amorphous silicon layer to form the amorphous silicon layer having the first region and the second region.

12. The method according to claim 8, wherein the step of forming an amorphous silicon layer comprises:
   forming a first amorphous silicon layer with a third thickness;
   removing part of the first amorphous silicon layer; and
   forming a second amorphous silicon layer with the second thickness on the substrate, so that the sum of the second thickness and the third thickness substantially equals to the first thickness.

13. The method according to claim 8, wherein the step of completely melting the amorphous silicon layer comprises:
   scanning the amorphous silicon layer with an excimer laser, wherein the scanning direction has an included angle with respect to the extended direction of the first region and the second region.

14. The method according to claim 13, wherein the included angle is about 45 degrees.

15. The method according to claim 8, further comprising forming an insulating layer on the substrate before the step of forming an amorphous silicon layer.

16. The method according to claim 8, wherein the substrate comprises a glass substrate.

17. A method for crystallizing an amorphous silicon layer, the amorphous silicon layer having a first region and a second region, wherein the thickness of the first region being greater than the thickness of the second region, comprising:
   completely melting the amorphous silicon layer to form a melted amorphous silicon layer having a first melted region and a second melted region, so that a first temperature of a bottom center of the first melted region is lower than a second temperature of a top of the first melted region and a third temperature of the second melted region; and
   crystallizing the melted amorphous layer to form a polysilicon layer, so that the crystallization begins from the bottom center of the first region to the second region and to the top of the first region.

18. The method according to claim 17, wherein the step of completely melting the amorphous silicon layer comprises:
   scanning the amorphous silicon layer with an excimer laser, wherein the scanning direction has an included angle with respect to the extended direction of the first region and the second region.

19. The method according to claim 18, wherein the included angle is about 45 degrees.

20. The method according to claim 17, before the step of scanning the amorphous silicon layer with an excimer laser, further comprising:
   providing a substrate;
   forming an insulating layer on the substrate; and
   forming the amorphous silicon layer having the first region and the second region on the insulating layer.

* * * * *